(12) United States Patent
Rossi et al.

(10) Patent No.: US 7,755,679 B2
(45) Date of Patent: Jul. 13, 2010

(54) APPARATUS AND METHOD FOR REDUCING EDGE EFFECT IN AN IMAGE SENSOR

(75) Inventors: Giuseppe Rossi, Los Angeles, CA (US); Lester Kozlowski, Simi Valley, CA (US)

(73) Assignee: AltaSens, Inc., Westlake Village, CA (US)

( * ) Notice: Subject to any disclaimer, the term of this patent is extended or adjusted under 35 U.S.C. 154(b) by 491 days.

(21) Appl. No.: 11/715,736

(22) Filed: Mar. 7, 2007

(65) Prior Publication Data

US 2008/0218608 A1   Sep. 11, 2008

(51) Int. Cl.
    *H04N 9/64* (2006.01)
(52) U.S. Cl. ........................... 348/243; 348/294
(58) Field of Classification Search ......... 348/241–245, 348/294, 308
    See application file for complete search history.

(56) References Cited

U.S. PATENT DOCUMENTS

| 4,387,402 A | 6/1983 | Lewis |
| 4,678,938 A | 7/1987 | Nakamura |
| 6,424,375 B1 | 7/2002 | Fowler |
| 6,493,030 B1 | 12/2002 | Kozlowski et al. |
| 6,697,111 B1 | 2/2004 | Kozlowski |
| 6,777,660 B1 * | 8/2004 | Lee ........................... 348/308 |
| 7,067,786 B1 * | 6/2006 | Bencuya et al. ............. 348/308 |
| 7,172,922 B2 * | 2/2007 | Benjamin et al. ..... 257/E27.133 |
| 2008/0217712 A1 * | 9/2008 | Rossi et al. ................. 257/431 |
| 2008/0218615 A1 * | 9/2008 | Huang et al. ................ 348/294 |

OTHER PUBLICATIONS

PCT International Search Report.
Noble, Peter J.W., Self-Scanned Silicon Image Detector Arrays, IEEE Transactions On Electron Devices, vol. ED-15, No. 4, Apr. 1968 pp. 202-209.

* cited by examiner

*Primary Examiner*—Gevell Selby
(74) *Attorney, Agent, or Firm*—Reed Smith LLP (57) ABSTRACT

A method and apparatus for forming dummy pixels exhibiting electrical characteristics virtually identical to the clear pixels of the imaging array. Arrays of such dummy pixels are used to form regions that isolate the main imaging array and sub-arrays of optical black pixels while preventing edge effects. The dummy pixels are preferably clear but can also be covered with optical black. By setting quiescent operation in soft reset, the dummy pixels exhibit the diode ideality and $R_oA$ product that are typical of any of the pixels in the entire array.

18 Claims, 6 Drawing Sheets

APPARATUS AND METHOD FOR REDUCING EDGE EFFECT IN AN IMAGE SENSOR

BACKGROUND OF THE INVENTION

1. Field of the Invention

The present invention relates generally to image processing for electronic imaging sensors, and more particularly, to an apparatus and method for equalizing the dark current in pixels located on the periphery of an image sensor and thereby eliminating the so-called "edge effect" to optimize image quality.

2. Description of the Related Art

Optical black pixels ("OB pixels") are the reference pixels within an imaging sensor pixel array that should have virtually identical electrical characteristics as a standard active pixel, yet are insensitive to light. OB pixels are used by various image processing circuits in the sensor or camera to maintain a constant black level independent of gain, illumination, changes in sensor operating conditions, etc. An OB pixel's signal is normally processed using the same signal chain and timing as those that are photo-electrically responsive and form the image of interest. The latter pixels, which constitute the majority of pixels in an imaging sensor, are some times referred to as "Clear Pixels." While clear pixels form the actual image, OB pixels are indirectly used in the image formation process. Instead, OB pixels are used to track the environmental and operational status of the imaging sensor while also providing information regarding dark signal/current, column noise and line noise at the specific location of each OB pixel.

In an imaging System-on-Chip (iSoC) system, OB pixels are typically used as reference pixels for many calibration operations that enhance image quality. These include black clamp stabilization, flutter rejection, column noise suppression and line noise correction. In these and other algorithms, OB pixels must have similar dark signal response as a clear pixel; they must mimic the response that a clear pixel would normally have in the absence light to accurately establish the current vs. voltage (i-v) characteristic for general reference in the image sensor.

There is also a need for both clear and OB (i.e., opaque) pixels that are not necessarily read out to support signal processing operations. These so-called "dummy pixels" nevertheless help increase image quality by reducing edge effects that are either deleterious to the image processing or perturb clear and OB pixels.

In general, the i-v characteristic for a diode is described by the Shockley equation:

$$I = I_o(e^{qV_d/nkt} - 1)$$

$$I = I_o(e^{qV_d/nkt} - 1)$$

Where $I_o$ is the diode's saturation current, $V_d$ is the diode voltage, n is the diode ideality, k is Boltzman's constant and T is the Temperature. Depending on the local environment, processing conditions, etc., the saturation current can vary significantly from diode to diode. To account for practical issues, the Shockley equation can be alternately expressed:

$$I = n_d kT/q \times \frac{A_d}{R_oA} \times (e^{qV_d/n_dkT} - 1)$$

-continued $$I = n_d kT/q \times \frac{A_d}{R_oA} \times (e^{qV_d/n_dkT} - 1)$$

Where $n_d$ is the diode ideality for the specific diode and the parameter $R_oA$ is its resistance-area product at zero volts of applied bias, expressed in units of ohm-cm$^2$. While diode resistance and saturation current depend on area, the $R_oA$ product for a specific technology is independent of area and characterizes the quality of diode fabrication.

Different applications of an imaging sensor pixel array may require differing degrees of image quality. For instance, a CMOS sensor used in a studio broadcast camera to generate content for HDTV production (high-end application) requires significantly higher image quality than a CMOS sensor used in consumer camcorders (medium to low-end product application). In addition to the well known attributes such as sensitivity and low noise, other quality factors include drift-free operation and insensitivity to excess illumination. Maximizing image quality hence entails not only better clear pixel quality, but also better OB quality. Consequently, a critical property of an OB pixel (active or dummy) is how closely it truly represents the dark signal response of a clear pixel regardless of incident lighting and environment including physical and electrical stress. For instance, high end applications require an OB pixel to have significantly higher fidelity under extreme conditions, e.g., superior opacity, thermal stability, and well-behaved electrical characteristics including detector ideality, $n_d$, and $R_oA$ product.

In addition to the difficulty in achieving the necessary opacity in OB pixels without perturbing electrical characteristics, there is also a need for forming dummy pixels that generate the same nominal current as OB pixels and clear pixels. The total current in clear, dummy and an OB pixel is the sum of each diode's Shockley-Read current, photocurrent and the electrical bias current; it is expressed as the direct sum:

$$I_{total} = I - I_{photo} + \frac{V_d}{R_d}$$

where $R_d$ is the detector's resistance at the applied bias, $V_d$. The total current accumulated in clear pixels versus that in OB pixels should differ only by the clear pixel photocurrent, $I_{photo}$; $I_{photo}$ must be zero in OB and OB dummy pixels.

SUMMARY OF THE INVENTION

In general, dummy pixels are disclosed that exhibit identical electrical characteristics to any other pixel in the imaging array. This insures that the total current of each dummy pixel used in an array also containing clear pixels and OB pixels is roughly identical to the total current of a clear pixel. While an OB pixel used as a reference for signal processing is read each frame, a dummy pixel must look the same even though it may never be read, regardless whether it is opaque or light-sensitive. Further, the dummy pixels do not perturb the electrical characteristics of nearby pixels so that they can be used to isolate the various sub-arrays that compose an imaging array. Such dummy pixels are also placed at the edges of the imaging array to prevent discontinuities stemming from process-related, physical and electrical factors. Edge effects are thereby eliminated.

The preferred embodiment of the dummy pixel is a clear type with identical electrical characteristics to the clear pixels in the main imaging array. A second embodiment of the dummy pixel is optically black to support optional signal processing functions.

Dummy OB pixels are constituted in the present invention by:

1) forming the pixels within a standard production process wherein the light-blocking property of the OB pixel is formed separately from basic diode formation including the various annealing steps that mitigate implant damage. An improved method for forming an Optical Black layer separately from the underlying CMOS sensor process is disclosed in U.S. Pat. No. 7,547,573, entitled IMAGE SENSOR AND METHOD FOR MANUFACTURING THE SAME, issued Jun. 16, 2009, the disclosure of which is herein incorporated by reference in its entirety.

2) partitioning the pixel array into sub-arrays of clear pixels, dummy pixels, and OB pixels that may be isolated from supporting peripheral circuits by N-guard band regions. The latter guard band regions collect stray minority carriers and prevent extraneous minority carriers from offsetting the OB reference signal. Such guard bands are used in areas adjacent to, for example, high speed digital circuits that emit light as a by-product of hot carrier effects.

In addition to these two steps, dummy OB pixel formation is completed by operating the dummy pixels with the reset transistor biased in soft reset mode to prevent signal integration. This insures low-noise operation and minimizes generation of excess generation-recombination currents that alter diode ideality and/or $R_oA$ product.

Dummy clear pixel formation is completed by omitting step 1 and again operating these pixels with the reset transistor biased in soft reset mode. Dummy clear pixels are the main guard bands protecting the imaging array from deleterious edge effects since the omission of the OB step results in the best possible electrical match to the clear pixels in the imaging array.

Thus, in one embodiment, a dummy pixel may comprise a photodiode and a reset transistor connected to the photodiode, wherein the reset transistor is biased in a soft reset mode.

A method of the present invention may comprise forming at least one row or column of dummy pixels in an image sensor, wherein each dummy pixel comprises a pixel having a reset transistor permanently biased in a soft reset mode.

An image sensor formed according to the present invention may comprise an array of clear pixels, a plurality of sub-arrays of optical black pixels, and a plurality of sub-arrays of dummy pixels located between the array of clear pixels and the sub-arrays of optical black pixels, wherein each dummy pixel comprises a photodiode, and a reset transistor connected to the photodiode, wherein the reset transistor is biased in a soft reset mode.

A dummy pixel may be formed as either a clear pixel or an optical black pixel.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

In general, the present invention provides clear dummy pixels and Optical Black (OB) dummy pixels having virtually identical electrical characteristics as the clear pixels in the imaging sensor. The dummy pixels are not necessarily read out but form isolation regions within the array that do not create regional discontinuities resulting in edge effects. The dummy pixels are free of the impediments of existing techniques that complicate sensor design and production. Specifically, the Shockley currents generated in the dummy pixels of the various embodiments are approximately identical to the Shockley current of clear pixels. Furthermore, since there is effectively zero photocurrent generated in the dummy OB pixel, the specific photocurrent generated in each clear pixel represents the net signal relative to the black level. Existing techniques generally require significant changes to process technologies and these deviations are incompatible with standard wafer production.

The present invention minimizes dispersion in the key photodetector characteristics $n_d$ and $R_oA$ in order to maximize imaging array uniformity (by minimizing edge effects) and to thereby maximize image quality produced by the imaging sensor. In other words, the idealities and $R_oA$ products for clear and OB pixels should be roughly identical and consistent with the generic diode formation technology regardless of the pixel's location and function. Thus, according to the present invention, dummy pixels are clear pixels which do not have to be read out, but are biased in an alternative configuration that enables attainment of intrinsic performance regardless of pixel location. The clear dummy pixels are used to isolate regions of clear active pixels from OB pixels without inducing edge effects. OB dummy pixels are alternately used for isolation and signal processing operations.

According to an embodiment of the present invention, fabrication of dummy pixels is effectively partitioned into two principal areas: 1) electrical performance and 2) optical performance. By addressing each area in a step by step manner, image sensor electrical performance is unaffected by the additional processing needed to optimally form OB pixels, apply color filters, form microlenses, apply a protecting layer over the sensor surface, and actually operate the various pixels.

Figure 1:
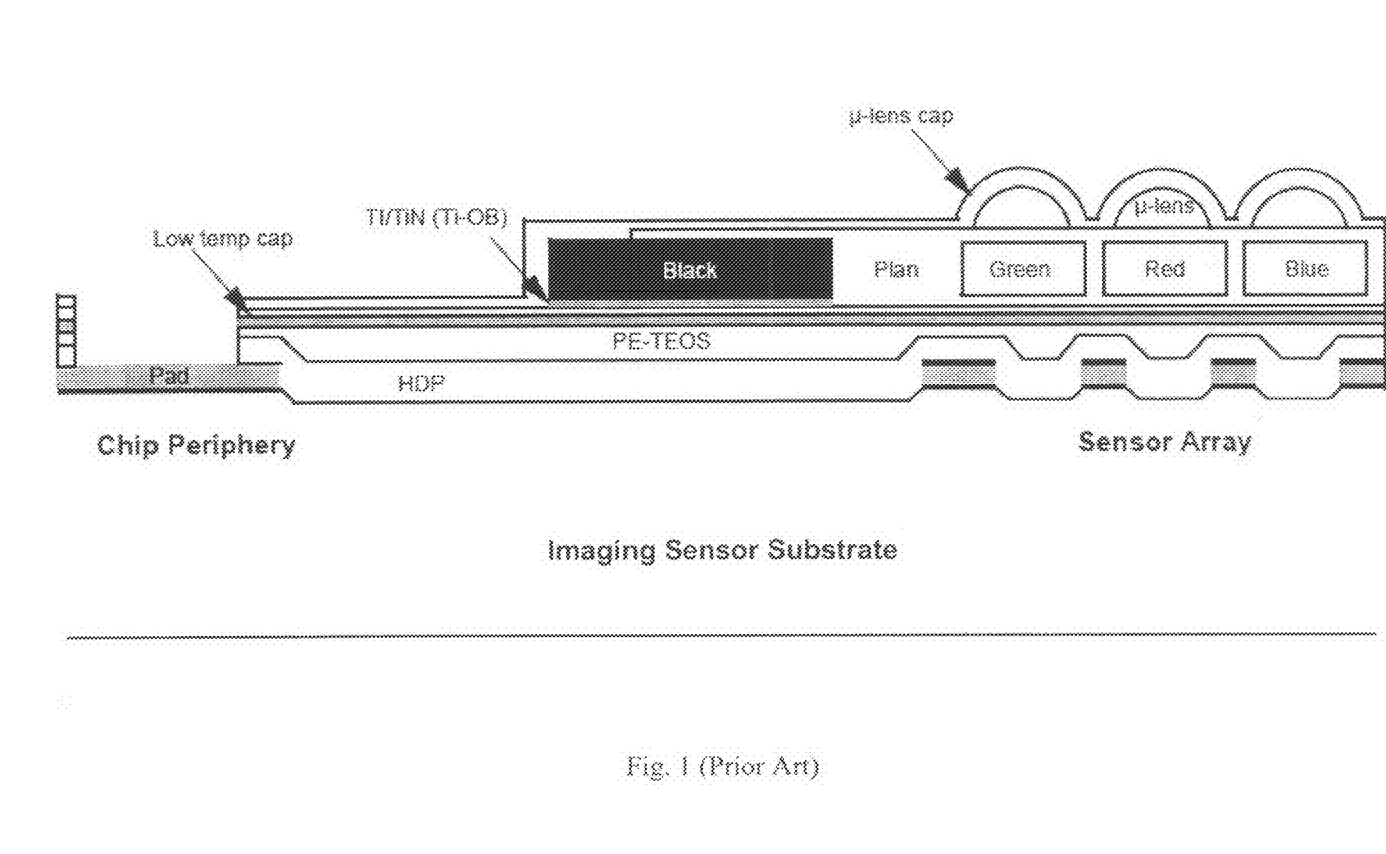
FIG. 1 is a cross-section diagram illustrating Ti/TiN Optical Black pixel structure used in OB and dummy pixels.

An improved method for forming an Optical Black layer separately from the underlying CMOS sensor process is disclosed in U.S. Pat. No. 7,547,573, entitled IMAGE SENSOR AND METHOD FOR MANUFACTURING THE SAME, issued Jun. 16, 2009, the disclosure of which is herein incorporated by reference in its entirety. This application describes a method of forming the Optical Black layer by depositing a Ti/TiN layer over the top of the sensor passivation surface and immediately below the Color Filter Planarization layer (sees cross-sectional drawing in FIG. 1). The thickness of the metal mask used for OB formation to render the OB pixel opaque can be adjusted to increase opacity and decrease light transmission into the OB pixel, but is typically on the order of 1000 Å when applied via standard sputtering means. By depositing the Ti/TiN layer over the sensor after the bulk of the critical steps are completed, basic pixel performance is separately optimized from OB performance with respect to opacity. In other words, pixel performance is optimized separately from the steps needed to optimize the properties of the optical black, color filters and microlenses.

Figure 4:
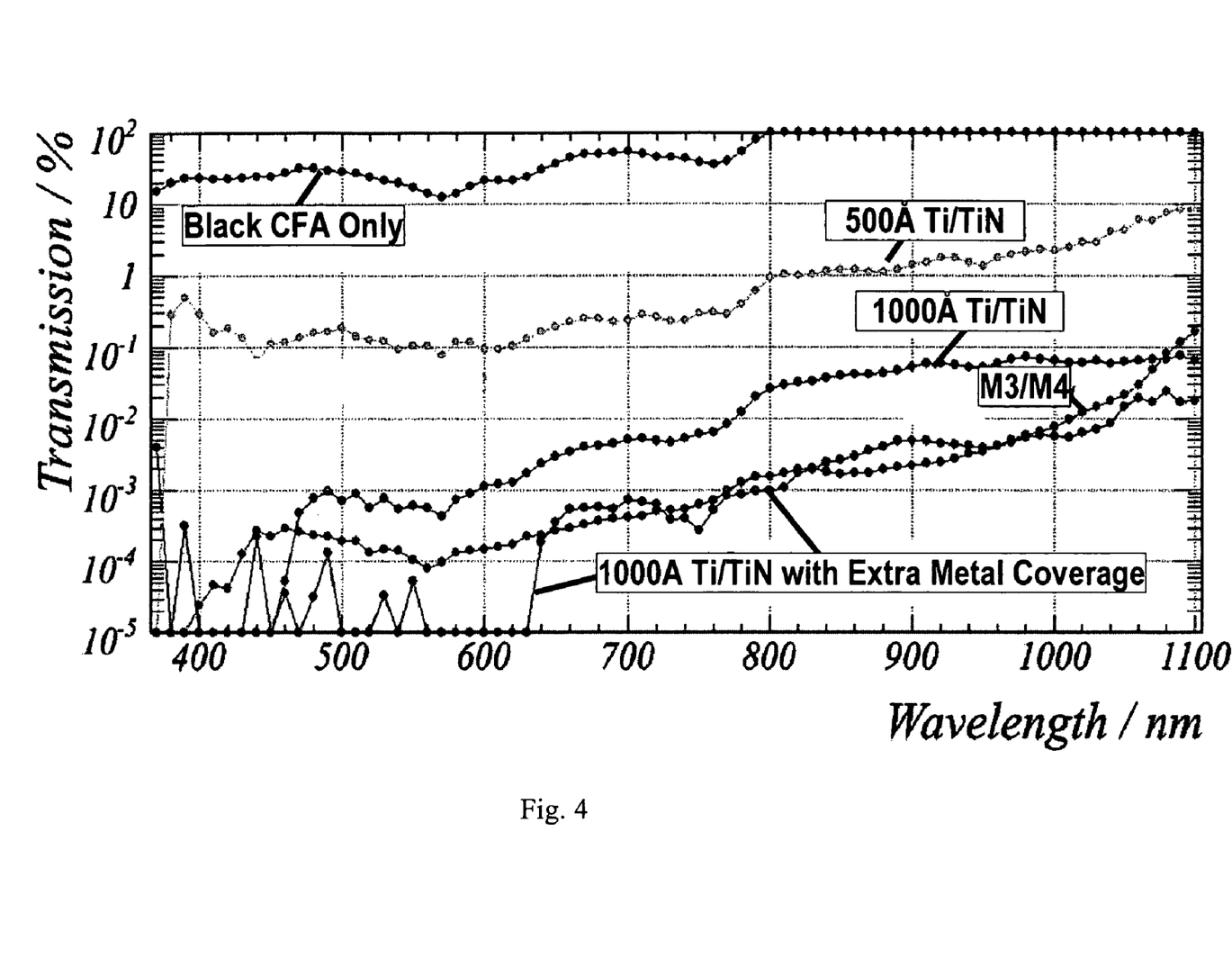
FIG. 4 is a graph of Optical Black pixel spectral response for different OB technologies, including an embodiment of the present invention.
Figure 5:
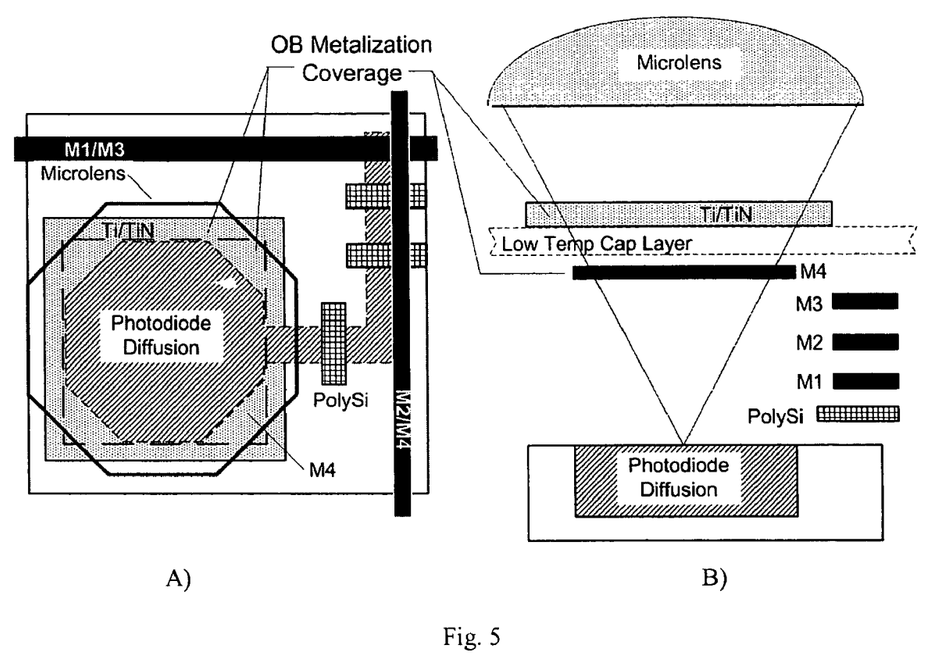
FIG. 5A is a top-view illustration of an embodiment of the dummy OB pixel structure of the present invention.
FIG. 5B is a side-view illustration of an embodiment of the dummy OB pixel structure of the present invention.

Light transmission is rendered negligible by using the Ti/TiN overlayer as shown in the transmission plot of FIG. 4. While the overlayer blocks incident light from reaching the photodiode, it does not occlude the entire pixel area to enable annealing ions to diffuse through the sensor overlayers to the photodiode. FIG. 5A shows a top layer view of the pixel layout including the location of the Ti/TiN pad over the photodiode and under the microlens. FIG. 5B is a cross-section plan showing how the Ti/TiN metallization blocks light focused by the microlens, yet allows the photodiode diffusion to be accessible to annealing ions during the final processing steps. The optical black pixel structure of FIG. 5 is further described in related U.S. patent application Ser. No. 11/715,799, filed Mar. 7, 2007, entitled APPARATUS AND METHOD FOR FORMING OPTICAL BLACK PIXELS WITH UNIFORMLY LOW DARK CURRENT, published as U.S. Patent Publication No. 2008/0217712, the disclosure of which is herein incorporated by reference.

In addition to the separately formed Ti/TiN layer, the pixel array of U.S. Pat. No. 7,547,573 is segmented into isolated sub-array blocks, as illustrated in FIG. 2.

The primary blocks include:
1. a physically isolated Clear Pixel array within the overall structure
2. clear dummy array regions that separate the Clear Pixel array from the supporting OB sub-array regions.
3. OB dummy array regions that may be optionally included in the dummy sub-arrays
4. optional guard band region comprising multiple N-diffusions that are heavily (3V) reverse biased to absorb excess minority carriers adjacent to areas of sensor self-emission during operation.

Figure 2:
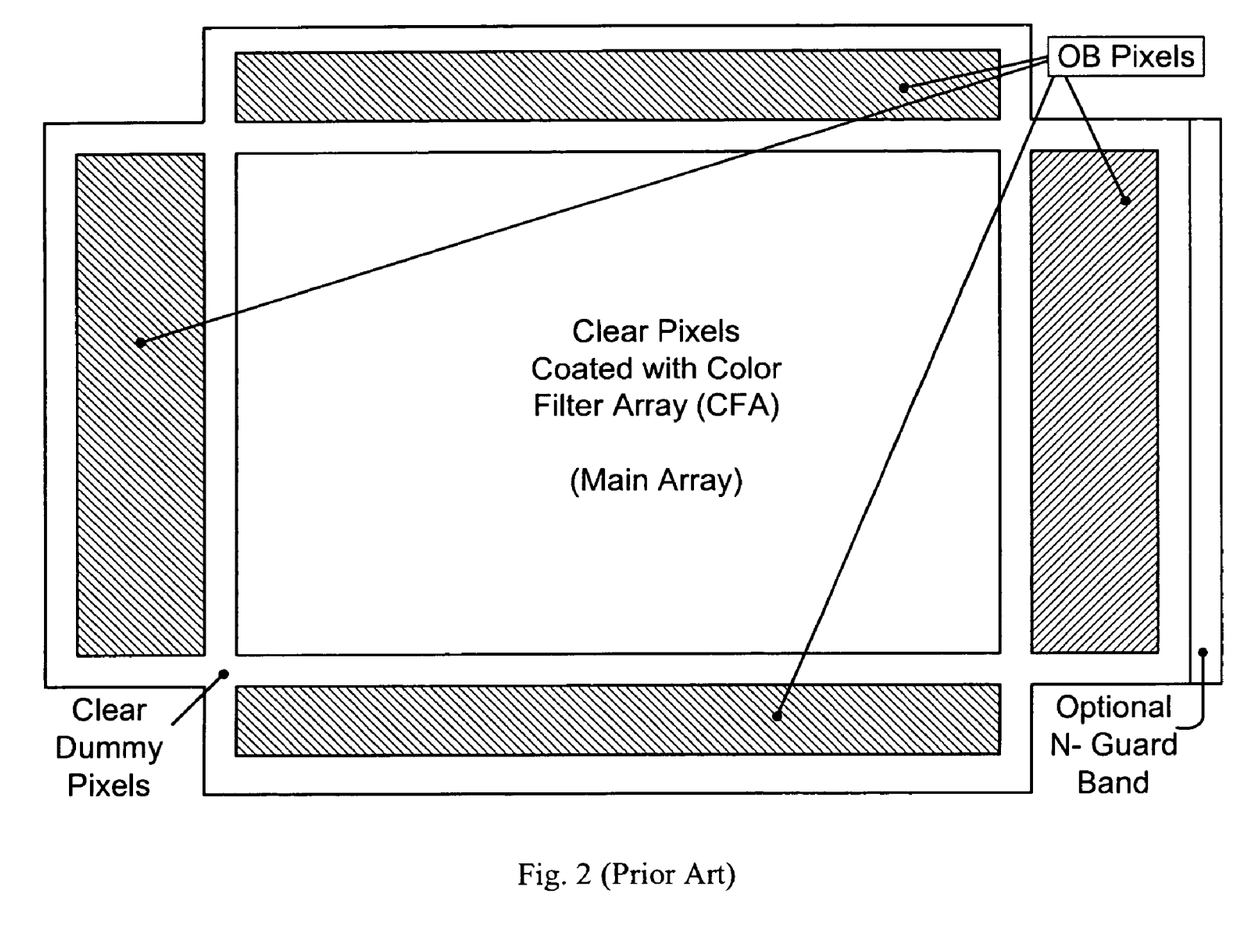
FIG. 2 is a floor plan of a pixel array wherein the total array is divided into a main image sensor array of Clear Pixels, several subarrays of Optical Black pixels, streets of dummy pixels that separate the clear and OB arrays, and a final N-guard band at one edge.

The clear dummy sub-arrays of FIG. 2 interconnect throughout the array and generally fill the physical space between the clear pixel array and the OB sub-arrays. Dummy arrays are also placed at the very edge of the array except when an optional n-guard band is used. The latter guard band is typically about 40 to 60 pixels wide, assuming pixel spacing of about 2 μm, as a collecting guard band of at least 100 μm width is needed to capture stray minority carriers that may be self-photogenerated or have been scattered or migrated from the clear pixel array or the peripheral circuits surrounding the entire pixel array. FIG. 2 shows an N-guard band located on the right side as it is assumed here that light-emitting digital circuits are present to the right of the pixel array. The N-guard band is composed of a series of diffusions formed with the same sensor implant and diffusion area as the clear pixels to also prevent creation of edge effects while forming an effective sink for stray minority carriers.

Figure 3A:
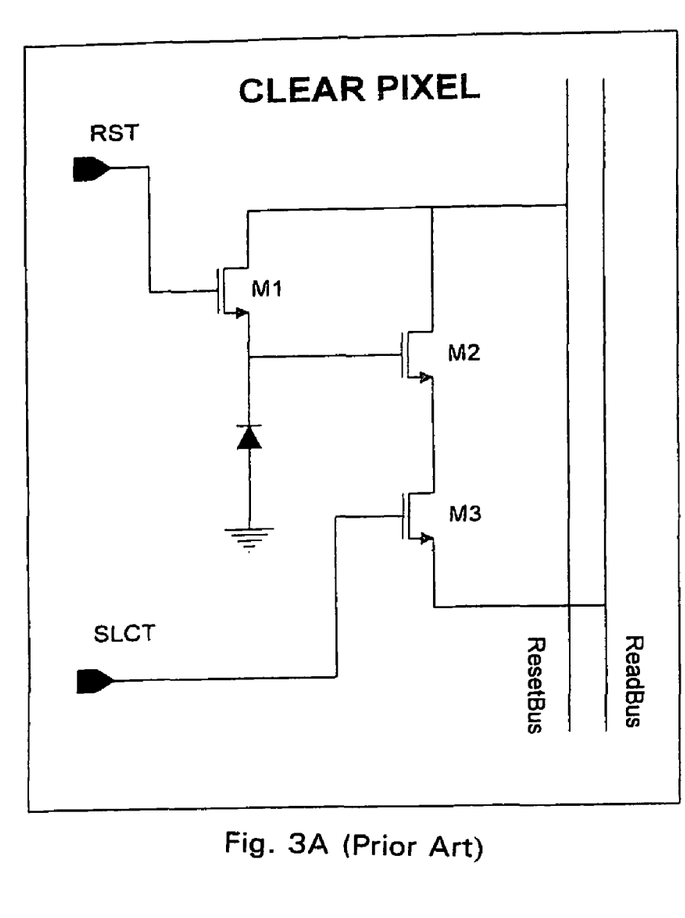
FIG. 3A is a schematic of a standard Clear Pixel of the Prior Art.
Figure 3B:
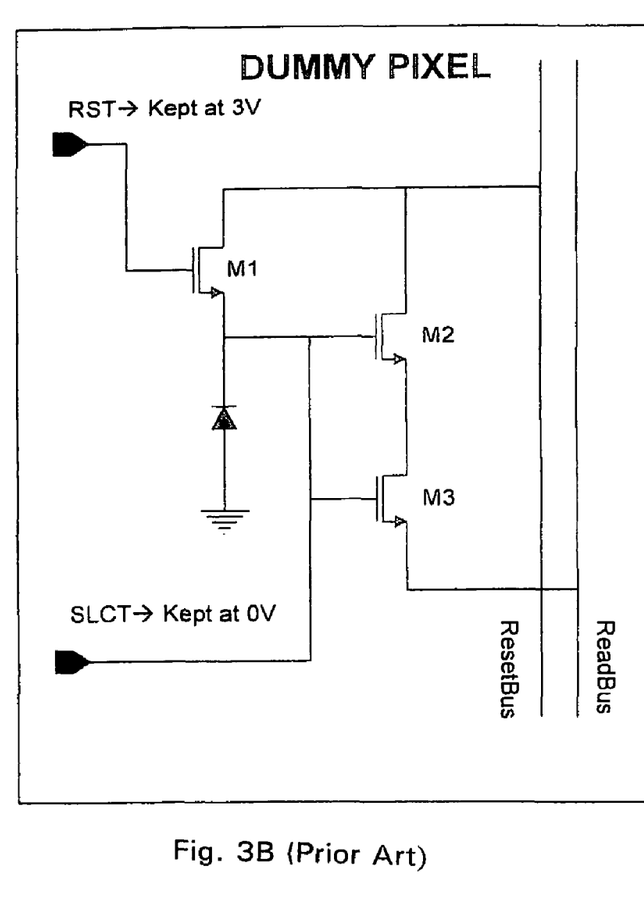
FIG. 3B is schematic of a standard Dummy Pixel of the Prior Art.

The schematic circuits of prior art clear pixels and dummy pixels are compared in FIG. 3. Previously, each dummy pixel photodiode was kept at 0V potential by physically connecting the Select signal (SLCT) to the photodiode diffusion and imposing the condition, for dummy pixels, that the SLCT signal be held at 0V. Such a bias condition corresponds to full well saturation and is therefore largely unfavorable for attracting large numbers of minority carriers in the typical p-type substrate (electron). Consequently, while this type guard band can capture a few stray photo-generated signals from the underlying bulk, it can not minimize dark current accumulation in the neighboring pixels. Most importantly, holding dummy pixels at 0V resulted in excess generation-recombination current compared to active pixels.

Pixels located at the periphery of the pixel array in imaging sensors, i.e., at the outside edges of the pixel structure, typically show an anomalous behavior that is often referred to as edge effect. For example, pixel dark current is often higher along the sensor perimeter. Hence, pixels belonging to, or in proximity of, the pixel array edges normally can not be used as imaging or OB pixels. To reduce the drawback of having imaging pixels too close to the pixel array edges, a certain number of clear pixels can be used as a buffering region. However, this approach results in a wasted silicon real estate and ultimately in higher product cost.

Significant improvement in minimizing edge effects in the horizontal direction is achieved by using an improved type of dummy pixel. A key point is to devise the dummy pixel configuration so that it helps stabilize the local environment while deflecting minority carriers away from the edges of the pixel array and operating at a quiescent bias that best mimics clear pixels. Another key point is that the dummy pixel is not encumbered with optical black to further insure that its properties are virtually identical to those of clear pixels in the imaging array.

Figure 6:
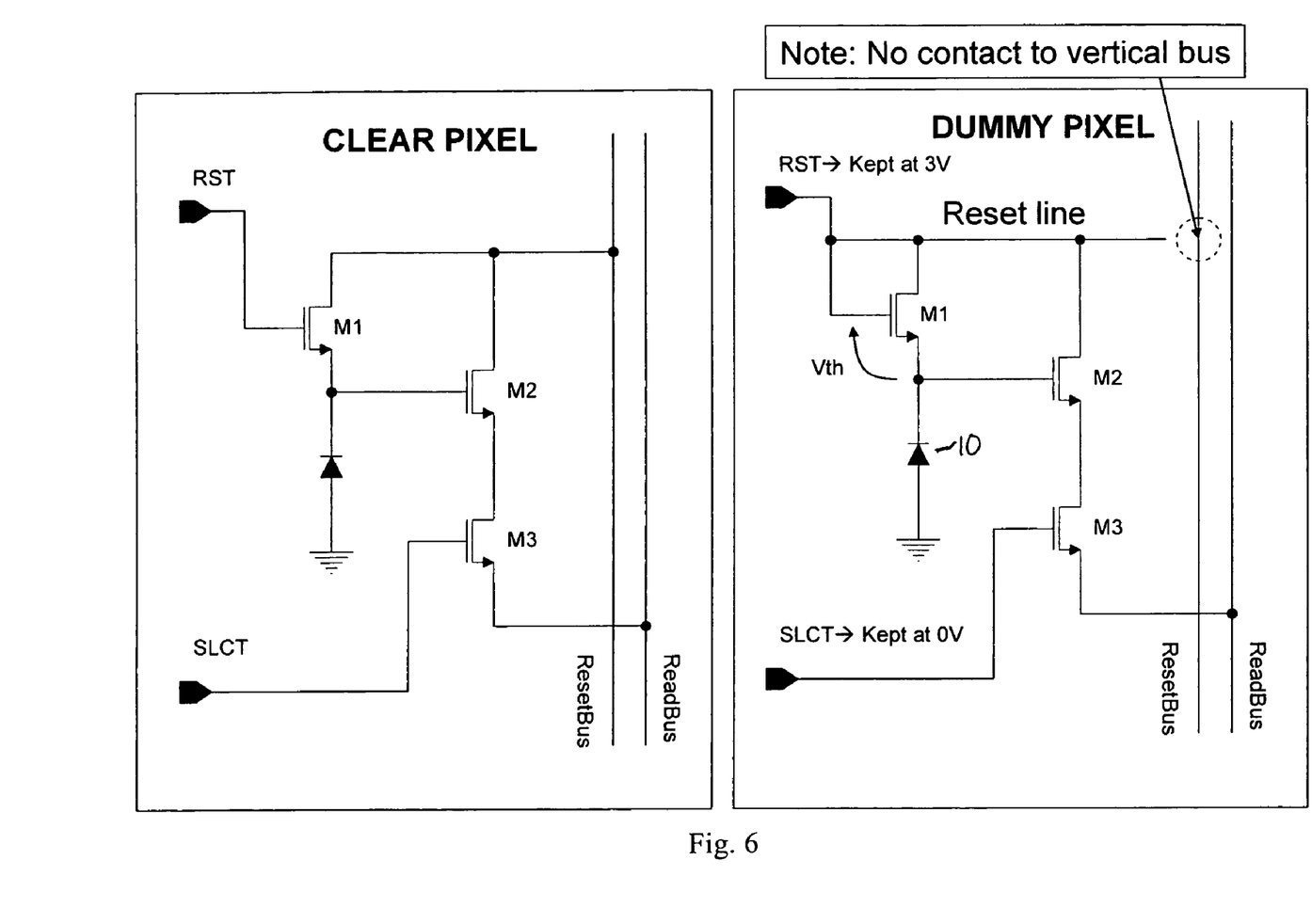
FIG. 6 is a schematic comparing a clear pixel to the dummy pixel of the present invention.

The present invention includes a preferred embodiment of this isolation strategy. As shown in FIG. 6, the dummy pixel consists of a clear pixel that is configured with the reset transistor biased in soft reset mode. Those skilled in the art will appreciate that such a photodiode dynamically pulls minority carriers that are within one diffusion length toward this higher potential (Vaa-Vth; i.e., one threshold voltage below the analog supply voltage) rather than letting them drift in the substrate. By constantly keeping the dummy photodiodes biased in this very favorable electrical condition, the associated junctions collect the stray electrons (minority carriers) rather than letting them continue to drift and scatter through the substrate. The dummy photodiode of the preferred embodiment thus acts a sink for any stray electrons within a diffusion length of the junction. Consequently, this structure substantially reduces excess dark current generation along the edges of the pixel array and thereby eliminates the edge effect.

FIG. 6 further compares the configuration of a clear pixel to that of a dummy pixel. A photodiode 10 is connected to a source of a reset transistor M1. The gate and drain of the reset transistor M1 are connected to a reset line, which is set to the supply voltage of the circuit. The photodiode 10 diffusion of a dummy pixel is held in soft reset by biasing reset transistor M1 at just below its threshold voltage so that it is operating in the sub-threshold voltage region. In practical terms, since some amount of dark current will always be discharging the photodiode 10, reset transistor M1 can be considered to be in subthreshold bias. In this regime, the photodiode 10 is never directly connected to the RST node that is otherwise kept at a high potential such as the full analog supply voltage, e.g., 3V. The photodiode 10 is thus operated at a voltage that is one threshold voltage below 3V. This configuration intrinsically decouples the photodiode node from the drain of reset transistor M1 to advantageously decouple power supply noise from the OB photodiodes. This coupling noise would otherwise be injected from the power supply node into the pixel array substrate and result in loss of image quality. Hence the shielding mechanism provided by the reset transistor M1, by virtue of its being in the sub-threshold region rather than operating as a low impedance is provides a significant improvement.

The dummy pixel circuit further includes an amplifier transistor M2 having a gate connected to the photodiode 10 and a source of the reset transistor M1. A drain of the amplifier transistor M2 is connected to the reset line. A readout transistor M3 has a drain connected to a source of the amplifier transistor M2, and a source connected to a read bus. A gate of the readout transistor M3 is preferably held at zero volts.

Compared to a clear pixel layout, this configuration of dummy pixels requires the removal of a "via" contact that would otherwise connect reset transistor M1 to the metal bus supporting reset across each row of pixels. This via contact is present in the clear pixels. It also requires connecting the gate of the reset transistor M1 to its drain terminal. This connection can be implemented by adding a metal 1 bridge shape to the existing clear pixel layout. Since the OB modifications pose minimum intrusion to the clear pixel layout, they are perfectly suited in minimizing any impact to the symmetry of the pixel array to enable virtually identical behavior amongst the clear and OB pixels apart from response to light.

By setting operation in this thermal equilibrium condition, the $R_oA$ products of the dummy pixels are not degraded from the value set by the production process to match the intrinsic $R_oA$ products of the clear pixels. Similarly, the diode idealities of dummy and clear pixels also largely match such that the Shockley currents are effectively identical:

$$I_{dummyOB} = I_{dummy} = I_{Clear} = n_d kT/q \times \frac{A_d}{R_oA} \times (e^{qV_d/n_d kT} - 1)$$

$$I_{dummyOB} = I_{dummy} = I_{Clear} = n_d kT/q \times \frac{A_d}{R_oA} \times (e^{qV_d/n_d kT} - 1)$$

Photodiode ideality $n_d$ is not degraded because the bias conditions set forth by this invention prevent the depletion region from exciting mid-gap states. The ideality is hence set by the photojunction quality at each pixel. The present invention hence minimizes dispersion in the key photodetector characteristics $n_d$ and $R_oA$ and thereby maximizes pixel uniformity (by minimizing edge effects) and the final image quality produced by the imaging sensor.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A dummy pixel comprising:
   a photodiode; and
   a reset transistor connected to the photodiode, wherein the reset transistor is biased in a soft reset mode;
   wherein the reset transistor has a gate and drain connected to a reset line, and wherein the reset line is set to a first predetermined voltage.

2. The dummy pixel of claim 1, wherein the reset line is not connected to a reset bus.

3. The dummy pixel of claim 2, further comprising an amplifier transistor having a gate connected to the photodiode and a source of the reset transistor, and a drain connected to the reset line.

4. The dummy pixel of claim 3, further comprising a readout transistor having a drain connected to a source of the amplifier transistor, and having a gate connected to a second predetermined voltage.

5. The dummy pixel of claim 4, wherein the first predetermined voltage is a circuit supply voltage.

6. The dummy pixel of claim 5, wherein the second predetermined voltage is zero volts.

7. The dummy pixel of claim 1, wherein the photodiode forms a current sink for stray electrons.

8. The dummy pixel of claim 1, wherein the dummy pixel is formed as a clear pixel.

9. The dummy pixel of claim 1, wherein the dummy pixel is formed as an optical black pixel.

10. A method for reducing dark current in an image sensor, the method comprising:
    forming at least one row or column of dummy pixels in an image sensor;
    wherein each dummy pixel comprises a pixel having a reset transistor permanently biased in a soft reset mode; and
    wherein a photodiode in each dummy pixel sinks current for stray electrons.

11. The method of claim 10, wherein the pixel is formed as a clear pixel.

12. The method of claim 10, wherein the pixel is formed as an optical black pixel.

13. The method of claim 10, wherein the at least one row or column of dummy pixels is formed on a perimeter region of the image sensor to reduce edge effect.

14. The method of claim 10, wherein the at least one row or column of dummy pixels is formed between sub-arrays of the image sensor to isolate the sub-arrays from each other.

15. An image sensor comprising:
    an array of clear pixels;
    a plurality of sub-arrays of optical black pixels; and
    a plurality of sub-arrays of dummy pixels located between the array of clear pixels and the sub-arrays of optical black pixels, wherein each dummy pixel comprises:
    a photodiode; and
    a reset transistor connected to the photodiode, wherein the reset transistor is biased in a soft reset mode, and wherein the reset transistor has a gate and drain connected to a reset line, and wherein the reset line is set to a first predetermined voltage; and wherein the reset line is not connected to a reset bus.

16. The image sensor of claim 15, further comprising sub-arrays of dummy pixels located on perimeter of the image sensor to reduce edge effect.

17. The image sensor of claim 15, wherein the dummy pixels are formed as clear pixels.

18. The image sensor of claim 15, wherein the dummy pixels are formed as optical black pixels.

* * * * *